(12) United States Patent
Tessler et al.

(10) Patent No.: US 6,603,139 B1
(45) Date of Patent: Aug. 5, 2003

(54) POLYMER DEVICES

(75) Inventors: Nir Tessler, Haifa (IL); Henning Sirringhaus, Cambridge (GB); Richard Henry Friend, Cambridge (GB)

(73) Assignee: Cambridge Display Technology Limited, Cambridge (GB)

( * ) Notice: Subject to any disclaimer, the term of this patent is extended or adjusted under 35 U.S.C. 154(b) by 0 days.

(21) Appl. No.: 09/673,122

(22) PCT Filed: Apr. 16, 1999

(86) PCT No.: PCT/GB99/01176

§ 371 (c)(1),
(2), (4) Date: Jun. 6, 2001

(87) PCT Pub. No.: WO99/54936

PCT Pub. Date: Oct. 28, 1999

(30) Foreign Application Priority Data

Apr. 16, 1998 (GB) ............................................. 9808061

(51) Int. Cl.[7] ............................................. H01L 51/00

(52) U.S. Cl. ........................... 257/40; 257/290; 438/82

(58) Field of Search ....................... 257/40, 290; 438/82

(56) References Cited

U.S. PATENT DOCUMENTS

| | | | |
|---|---|---|---|
| 5,331,138 A | 7/1994 | Saroya | 257/40 |
| 5,500,537 A | 3/1996 | Tsumura et al. | 257/40 |
| 5,596,208 A | 1/1997 | Dodabalapur et al. | 257/66 |
| 5,612,228 A | 3/1997 | Shieh et al. | 437/1 |
| 5,629,533 A | 5/1997 | Ackley et al. | 257/80 |
| 5,854,139 A | 12/1998 | Aratani et al. | 438/780 |
| 5,892,244 A * | 4/1999 | Tanaka et al. | 257/40 |
| 5,936,259 A | 8/1999 | Katz et al. | 257/40 |

FOREIGN PATENT DOCUMENTS

| | | |
|---|---|---|
| EP | 0528662 | 2/1993 |
| EP | 0575187 A1 | 12/1993 |
| EP | 0716459 | 6/1996 |
| EP | 0717445 A2 | 6/1996 |
| EP | 0786820 A2 | 7/1997 |
| FR | 2360177 | 2/1978 |
| WO | WO 90/08402 | 7/1990 |

OTHER PUBLICATIONS

Jackson et al., "Organic Thin–Film Transistors for Organic Light–Emitting Flat–Panel Display Backplanes," IEEE Journal of Selected Topics In Quantum Electronics, vol. 4, No. 1, Jan. 1998, pp. 100–104, XP002110213.

Database Inspec Online! Institute of Electrical Engineers, Stevenage, GB, MA E. Y. et al., "Organic Light–Emitting Diode/Thin Film Transistor Integration for Foldable Displays," Database Accession No. 6194905, XP002110246, and Conference Record of the 1997 International Display Research Conference and International Workshops on LCD Technology and Emissive Technology Proceedings of 1997 International Display Research Conference and Workshops, Toronto, Ont., Canada, 15–19 S, pp. L78–L81, 1997, Santa Ana, CA, USA, Soc. Inf. Display, USA.

(List continued on next page.)

Primary Examiner—Jerome Jackson
(74) Attorney, Agent, or Firm—Finnegan Henderson Farabow Garrett & Dunner LLP

(57) ABSTRACT

An integrated circuit device comprising: a current drive switching element having an input electrode, an output electrode, a switchable region comprising a semiconductive polymer material electrically coupled between the input electrode and the output electrode, and a control electrode electrically coupled to the switchable region so as to allow the application of a bias to the control electrode to vary the flow of current through the switchable region between the input electrode and the output electrode; and a second circuit element integrated with the switching element, and electrically coupled with the input electrode of the switching element for receiving a drive current from the switching element.

87 Claims, 9 Drawing Sheets

OTHER PUBLICATIONS

Brown et al., "Logic Gates Made From Polymer Transistors And Their Use In Ring Oscillators," Science, vol. 270, Nov. 10, 1995, pp. 972–974, XP000644682 ISSN: 0036–8075.

Brown et al., "Field–Effect Transistors Made From Solution–Processed Organic Semiconductors," Synthetic Metals, Apr. 30, 1997, Elsevier, Switzerland, vol. 88, No. 1, pp. 37–55, XP002110216, ISSN: 0379–6779.

Bao et al., "Soluble And Processable Regioregular Poly(3–Hexylthiophene) For Thin Film Field–Effect Transistor Applications With High Mobility," Applied Physics Letters, vol. 69, No. 26, Dec. 23, 1996, pp. 4108–4110, XP002059693, ISSN: 0003–6951.

Carter et al., "Polymeric Anodes For Improved Polymer Light–Emitting Diode Performance," Applied Physics Letters, Apr. 21, 1997, AIP, USA, vol. 70, No. 16, pp. 2067–2069, XP002110222, ISSN: 0003–6951.

Hiramoto et al., "Up–Conversion Of Red Light To Green Light By A New Type Of Light Transducer Using Organic Electroluminescent Diode Combined With Photoresponsive Amorphous Silicon Carbide," Applied Physics Letters, vol. 58, No. 11, Mar. 18, 1991, pp. 1146–1148, XP000209773, ISSN: 0003–6951.

* cited by examiner

POLYMER DEVICES

BACKGROUND OF THE INVENTION

This invention relates to polymer devices, for instance transistors that comprise a semiconductive polymer material.

There has been extensive work on transistors made with organic materials. Insulated gate field effect transistors (FETs) have been made with polymer semiconductors deposited by solution processing of either the polymer itself or a precursor to form a layer of the final polymer. FIG. 1 shows the general structure of such a device. Under the semiconductor polymer layer 1 are two spaced apart metallic electrodes, the drain electrode 2 and the source electrode 3 of the transistor. Below them are a layer 4 of $Si/SiO_2$ and a metallic gate electrode 5. The device acts as a switch because current flow between the source and drain electrodes is greatly increased when a bias is applied to the gate electrode. One such device, in which the semiconductor polymer is regioregular poly-hexylthiophene (P3HT), is described in more detail in Z. Bao et al., Appl. Phys. Lett. 69, 4108 (1996).

Devices of this type have several problems (see A. R. Brown et al., Science 270, 972 (1995)). First, the through-current from the source to the drain is low because the electronic carrier mobility $\mu$ is typically in the range from $10^{-4}$ to $10^{-6}$ $cm^2/Vs$. (See J. H. Burroughes et al., Nature 335, 137 (1988) and A. R. Brown et al., Synthetic Metals 88, 37 (1997)). Most solution-processed polymers have a disordered structure, and it is believed that in these systems the carrier mobility is limited by variable-range hopping between polymer chains. This low mobility rules out such transistors for general current-supply applications. Second, the on-off ratio, i.e. the ratio between the through-current in the on and off states, is poor: less than $10^4$ for example. Up to now a polymer transistor with a performance comparable to that of inorganic amorphous silicon transistors has not been demonstrated. As a consequence a preferred approach has been to use molecular (or oligomer) organic materials instead of polymers. Molecular devices tend to have improved electrical performance but have severe process shortcomings. First, the molecules are generally deposited by vacuum sublimation, typically at substrate temperatures around 100–200° C. This rules out the use of such molecular materials on heat-sensitive substrates. Second, the molecular materials are generally not robust; there are serious concerns about the effect of cracks and microcracks in highly crystalline sublimed molecular films, in particular if deposited on flexible plastic substrates. Third, molecular devices are highly sensitive to subsequent processing steps. Attempts to post-process sublimed molecular films, for example to deposit subsequent layers on top of the sublimed films for multilayer integrated devices, have generally resulted in greatly reduced performance of the buried FETs.

SUMMARY OF THE INVENTION

According to a first aspect of the present invention there is provided an integrated circuit device comprising: a current drive switching element having an input electrode, an output electrode, a switchable region comprising a semiconductive polymer material electrically coupled between the input electrode and the output electrode, and a control electrode electrically coupled to the switchable region so as to allow the application of a bias to the control electrode to vary the flow of current through the switchable region between the input electrode and the output electrode; and a second circuit element, integrated with the switching element, and electrically coupled with the output electrode of the switching element for receiving a drive current from the switching element.

According to a second aspect of the present invention there is provided a method for forming an electronic device having a region comprising a semiconductive polymer material, the method comprising depositing the semiconductive polymer by a process which promotes ordering in the deposited polymer. The electronic device according to this aspect of the invention may suitably be a switching element, for example of the type as set out above in relation to the first aspect of the invention.

According to a third aspect of the present invention there is provided an integrated circuit device comprising: a switching element having an input electrode, an output electrode, a switchable region comprising a semiconductive polymer material electrically coupled between the input electrode and the output electrode, and a control electrode electrically coupled to the switchable region so as to allow the application of a bias to the control electrode to vary the flow of current through the switchable region between the input electrode and the output electrode; and an electro-optical circuit element, integrated with the switching element, and electrically coupled to one of the electrodes of the switching element.

The semiconductive polymer may, for instance, be a conjugated polymer (see, for example, PCT/WO90/13148, the contents of which are incorporated herein by reference) or an "intermolecular" semiconducting polymer like poly-vinylcarbazole (PVK) containing short conjugated segments connected by non-conjugated segments.

An insulating layer may be deposited directly or indirectly on top of the electronic device. Preferably this does not substantially degrade the performance of the device. A second circuit element (as in the first aspect of the invention) may also be formed, and is preferably integrated with the said electronic device.

The second circuit element (or the opto-electrical element of the third aspect of the invention) is preferably an element that stores or consumes (preferably significant) electrical energy, e.g. by converting current to an electrical or opto-electrical signal, or an element that converts an optical signal into an electrical signal, e.g. a voltage or a current. The second circuit element is preferably not a switching element. The second circuit element is suitably capable of emitting or detecting light and/or varying the transmission of light through itself. Examples include light-emissive devices, photovoltaic devices and devices such as liquid crystal devices. The device may suitably emit or detect an optical signal, it may be a display device and/or form part of a visual display. The second circuit element preferably requires a significant drive current for its operation.

Where the second circuit element is a light-emissive element it is preferred that it comprises one or more light-emissive organic materials. The or each light-emissive organic material may be a polymer material, preferably a conjugated or partially conjugated polymer material. Suitable materials include poly-phenylene-vinylene (PPV), poly (2-methoxy-5(2'-ethyl)hexyloxyphenylene-vinylene) (MEHPPV), PPV-derivatives (e.g. di-alkoxy or di-alkyl derivatives), polyfluorenes and/or co-polymers incorporating polyfluorene segments, PPVs and/or related copolymers (see, for example, PCT/WO90/13148). Alternative materials include organic molecular light-emitting materials, e.g. tris (8-hydroxyquinoline)aluminium (Alq3) (see, for example, U.S. Pat. No. 4,539,507, the contents of which are incorporated herein by reference), or any other small sublimed molecule or conjugated polymer electroluminescent material as known in the prior art (see, for example, N. C. Greenham and R. H. Friend, Solid State Physics (Academic Press, San Diego, 1995) Vol. 49, pp 1–149). The light emitted by the device may be inside or outside the visible spectral range (400–800 nm). In the latter case materials such as LDS-821 (A. Dodabalapur et al., IEEE J. Selected Topics in Quantum Electronics 4, 67 (1998)) may be used.

The light-emissive element preferably comprises a cathode for injecting negative charge carriers (electrons) and an anode for injecting positive charge carriers (holes). There is preferably a region (suitably in the form of a layer) of light emissive material (suitably with other layers to improve performance) between the electrodes. The cathode preferably has a work function of less than 3.5 eV if a cathode or greater than 4.0 eV if a cathode. The material of the cathode is suitably a metal or alloy. Preferred materials include Sm, Yb, Tb, Ca, Ba, Li or alloys of such elements with each other and/or with other metals such as Al. The anode preferably has a work function of greater than 4.0 eV and preferably greater than 4.5 eV. Preferred materials include conductive oxides (such as ITO and tin oxide) and gold. Preferably one of the electrodes is light-transmissive to allow light generated in the device to escape. In one preferred configuration the output electrode of the switching element is also one electrode (the anode or the cathode) of the light-emissive element.

The said integrated circuit device is suitably made up of layers. Preferably the switching element is provided by a first layer and the second circuit element is provided by a second layer, so that the two elements are not co-planar. There is suitably an insulating layer between the first layer and the second layer, and there may be electrically conductive interconnects that pass through the insulating layer to electrically connect the switching element and the second circuit element. The terms "first layer" and "second layer" do not imply that the layers are deposited in any specific order: either layer could be deposited first.

There is preferably an insulating layer formed either directly or indirectly on top of the semiconductive polymer. The insulating layer may have a low electrical conductivity. It may be an inorganic dielectric such as $SiO_x$, MgF or an organic dielectric such as PMMA, polyimide, or polyvinylphenol (PVP). The insulating layer may be deposited by vacuum deposition techniques or solution processing. It may consist of a composite or a layered structure with several different components of different functionalities. The insulating layer may comprise a material that is capable of attracting residual dopants from the semiconductive polymer. The insulating layer preferably spaces subsequently deposited layers of the second circuit element from the semiconductive polymer. There may be means for electrical interconnection through the insulating layer, such as via holes preferably containing electrically conductive material. The insulating layer may act so as to at least partially encapsulate the semiconductor polymer. The insulating layer is preferably in contact with the semiconductive polymer, most preferably at a location between the input and output electrodes. The insulating layer is suitably of a material that tends to attract dopants such as oxygen from the semiconductive polymer. Oxygen acts as an unintentional dopant for most semiconductive polymers and reduces the ON/OFF current ratio of the switching element. One possibility is for the insulating layer to be of a silicon oxide, especially a sub-stoichiometric silicon oxide ($SiO_x$, x<2).

Where present, the insulating layer may provide one or more further advantageous features. The insulating layer may have different wetting properties to an adjacent conductive portion of the device (e.g. an electrode) to allow differential wetting effects to be used to guide the deposition of material in a desired location. The wetting properties of the surface of the insulating layer may be engineered to attract or repel subsequently deposited polymer material (suitably solution processable polymer material) and/or to enable the fabrication of a multilayer structure. The insulating layer and/or the electrodes on top of the semiconductive polymer may be used to overcome the solvent compatibility and surface wetting compatibility problems which arise when subsequent layers are deposited. By suitable choice of the insulating layer and its surface properties subsequent layers can be deposited from solvents which would otherwise dissolve or not wet the semiconductive polymer and/or layers underneath. The insulating layer may be capable of attracting dopants such as oxygen to inhibit degradation of the device. The insulating layer may assist in resisting delamination or other forms of mechanical failure due, for example, to differential thermal expansion of the materials on either side of it. The insulating layer may be used to planarize the underlying structure. It may have a composite or layered structure such that the interfaces with the first and second circuit elements may have different and optimum properties such as strong adhesion, or good wetting properties.

The switching element is preferably part of a control circuit for the second circuit element, such as an optical data transmission device or an active matrix control circuit for a light-emissive element in a visual display.

It is preferred that in the finished device the semiconductive polymer material is, at least in part, ordered as between polymer chains. One preferred form of ordering is for the polymer chains and/or the direction of strongest electronic overlap between adjacent polymer chains ($\pi$—$\pi$ stacking direction) to be predominantly in a plane that also includes a direction generally between the input and output electrodes. The polymer preferably has a conjugated backbone. The ordering may take the form of at least partial phase separation of the polymer. The polymer material is suitably a material that has a tendency to self-organise, preferably when dissolved in a suitable solvent. The polymer suitably has substituents either in or pendent from its backbone which promote ordering of adjacent polymer chains. The polymer may have hydrophobic side-chains. The ordering, whether self-ordering or imposed ordering is preferably into a lamellar structure, most preferably having alternating layers of certain characteristics—for instance alternating conjugated (partially or fully conjugated) and (at least substantially) non-conjugated layers and/or alternating main-chain and side-chain layers. The lamellae are preferentially in a plane that also includes a direction generally between the input and output electrodes.

One preferred form of the semiconductive polymer material is a backbone comprising thiophene groups with alkyl side-chains of a length in the range from $C_3$ to $C_{12}$. Poly-hexylthiophene is especially preferred.

More of the components of the device may be of organic materials. One or more (and most preferably all) of the electrodes may comprise an organic material, suitable a conductive material such as polyaniline or poly-ethylene-dioxythiophene, PEDOT doped with polystyrenesulphonic acid (PSS) (Carter et al., Appl. Phys. Lett. 70, 2067 (1997)). One or more (and most preferably all) of the insulating layers contained in the device may be an organic insulator such as polymethylmethacrylate (PMMA) (see G. Horowitz et al., Adv. Mat. 8, 52 (1996)). The whole device structure may be formed on an organic substrate.

The semiconductive polymer is preferably deposited on to a smooth surface. It is therefore preferred that the input and output electrodes are deposited over the semiconductive polymer and/or that the switchable region is in the form of a layer located between the switching electrode and the input and output electrodes.

The step of depositing the semiconductive polymer preferably comprises dissolving the polymer in a solvent in which the polymer has a tendency to self-organise and/or the step of coating the polymer from a solvent in which the polymer has a tendency to self-organise. In either case, the solvent may be chloroform. If the polymer is, for example, poly-hexylthiophene then the concentration of the polymer in the solvent may be in the range from 6 to 20, more preferably 11 to 15 and most preferably around 13 mg of polymer in 1 ml of solvent. The method of coating is suitably spin-coating, but other processes such as ink-jet printing may be suitable.

The semiconductive polymer is preferably in the form of a layer, and the thickness of the layer is suitably in the range from 200 Å to 1000 Å, preferably 400 Å to 600 Å, most preferably around 500 Å.

The step of depositing the semiconductive polymer is preferably performed in an inert atmosphere, for example nitrogen or argon.

The step of depositing the semiconductive polymer comprises preparing a substrate which may consist of a sequence of layers to promote the ordering of the polymer and depositing the polymer onto the substrate. This suitably results in preferential alignment of the polymer chains and/or the direction of strongest electronic overlap between adjacent polymer chains ($\pi$—$\pi$ stacking direction) parallel with the surface of the substrate. The step of preparing the substrate comprises making the surface of the substrate more hydrophobic and/or removing water from the surface and/or treating the surface with a silylating agent. The substrate is preferably maintained in an inert atmosphere between such treatment and deposition of the semiconductive polymer.

A method according to the present invention preferably includes the step of integrating an electrooptical device with the electronic device that incorporates the semiconductive polymer. The electrooptical device is suitably formed directly or indirectly on top of the electronic device, so that the two devices are in a stacked rather than a co-planar arrangement.

Alternative methods of deposition for the polymer/copolymer material(s) include spin-, blade-, meniscus-, dip-coating, self-assembly, ink-jet printing, etc. The polymer material(s) are preferably solution-processible. Layers of small molecule materials can be deposited by vacuum sublimation, etc.

The different layers of the device may be patterned laterally by a suitable technique such as shadow-mask evaporation, ink-jet printing, contact printing, photolithography, etc.

In general, the electronic device is preferably a switching device, more preferably a transistor.

BRIEF DESCRIPTION OF THE DRAWINGS

The present invention will now be described by way of example with reference to the accompanying drawings, in which.

DETAILED DESCRIPTION

Figure 2:
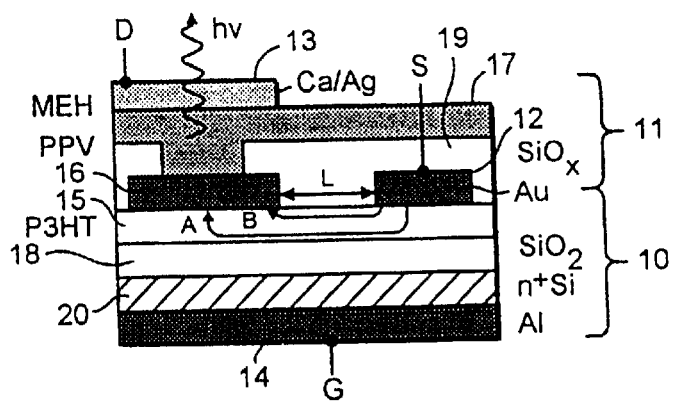
FIG. 2 shows a schematic cross-section of an integrated polymer transistor and polymer light-emissive device.

FIG. 2 shows a multi-layer device having an integrated transistor (indicated generally at 10) and light-emissive device (indicated generally at 11). The light-emissive device uses a conjugated polymer material, MEH-PPV, for light emission (D. Braun and A. J. Heeger, Appl. Phys. Lett. 58, 1982 (1991)). The transistor acts to switch the supply of current to the light-emissive device (LED), using a semiconductive layer of P3HT, another conjugated polymer. When a supply voltage is connected between source electrode 12 of the transistor and the cathode 13 of the LED and a bias is applied to the gate electrode 14 of the transistor, current flows from the source 12 through the semiconductor layer 15 of the transistor to the drain electrode 16. The drain 16 also acts as the anode of the LED so the current then flows from the drain 16 and through the light-emissive layer 17 of the LED to the cathode, causing light emission from the layer 17 as indicated at arrow hv. Insulating layers 18, 19 of silicon oxide and a layer of n⁺-doped silicon 20 lie between the semiconductor layer 15 and the gate 14 and separate the source 12 from the light-emissive layer 17. A device of this type has not previously been feasible because of the low mobilities of typically $10^{-4}$ $10^{-6}$ cm²/Vs (A. R. Brown et al., Synthetic Metals 88, 37 (1997)) and low through-current performance of prior polymer transistors compared to the relatively high current demands of LEDs, and the difficulties of post processing organic molecular transistors. For example, it has been found that highly crystalline molecular transistors tend to degrade significantly when subsequent layers are deposited on top of the active semiconductor, possibly as a consequence of micro-crack formation, whereas polymer transistors have the advantage that they are not typically prone to this mode of failure. As will be described in more detail below, through-currents in the range of 1 to 10 mA/cm² have been achieved with the present device, combined with successful post-processing of the transistor. This method of fabricating the transistor, which focuses on the promotion of ordering in the semiconductive polymer(s) results in significantly improved electrical performance compared to prior art devices. The polymer transistors reach mobilities up to 0/1 cm$^2$/Vs and ON/OFF current ratios of $10^6$–$10^8$ which is comparable to the performance of inorganic amorphous silicon transistors.

To fabricate the device a wafer is first prepared with a highly doped n$^+$-Si layer 20 covered by a 2300 Å dry thermal SiO$_2$ gate oxide layer (18) and backed by an aluminium gate electrode 14. The capacitance of the SiO$_2$ layer 18, $C_i$, is 15 nF/cm$^2$.

Figure 3:
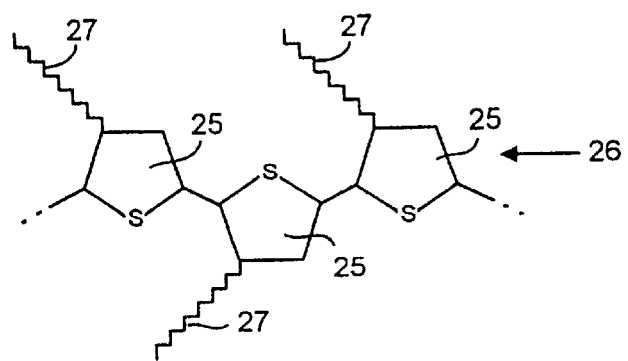
FIG. 3 shows the chemical structure of a P3HT polymer chain.

P3HT for the semiconductor layer 15 is synthesized by the Rieke route (see T. A. Chen et al., J. Am. Chem. Soc. 117, 233 (1995)). P3HT of this type is commercially available from Aldrich. The chemical structure of the P3HT is shown in FIG. 3. The polymer chain has a conjugated thiophene (25) backbone (indicated generally at 26) and C$_6$H$_{13}$ alkyl side-chains 27. The polymer is preferably highly regioregular, with head-to-tail coupling HT of the hexyl side chains at the 3-position of the thiophene rings suitably greater than 95%. (Less regioregular polymers could be used).

Figure 10:
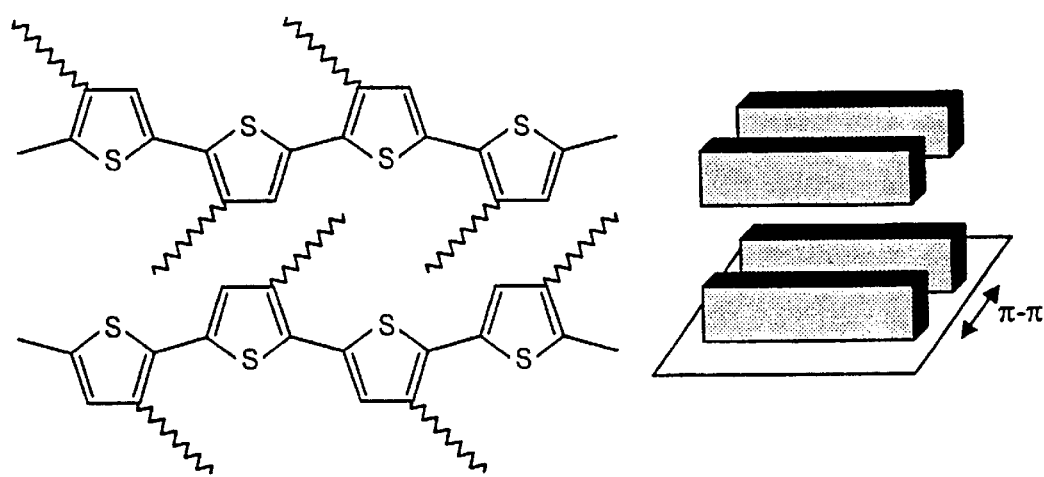
FIG. 10 shows the preferred lamellar ordering of the semiconductive polymer with flexible side chains with the lamellae parallel to the surface of the substrate.

The P3HT will be spin-coated on to the SiO$_2$ layer. First, however, steps are taken to improve the ordering of the eventual P3HT layer and the interface of the P3HT with the SiO$_2$. The aim is to support the adoption by the P3HT of the structure shown in an idealised form in FIG. 4 and FIG. 10, where the side-chains of the P3HT phase segregate, giving short-range order, and where the backbones of P3HT chains lie in the plane of the P3HT layer. The preferred structure is thus of a lamellar-type, with 2-dimensional conjugated layers formed by the backbones and π—π stacking of adjacent chains and separated by layers of phase-segregated sidechains. The structure of the P3HT layer can be investigated using X-ray diffraction. In practice the ordering is unlikely to be complete—there may be localised regions (domains) of short-range order and/or where the chains are in the preferred orientation and other disordered regions. Ordering may not extend through the entire thickness of the P3HT layer: it may for instance be limited to regions near one or both major surfaces. Improvements in device performance have been found to be provided even by limited degrees of ordering; it is not essential for there to be full ordering throughout the P3HT layer.

Figure 4:
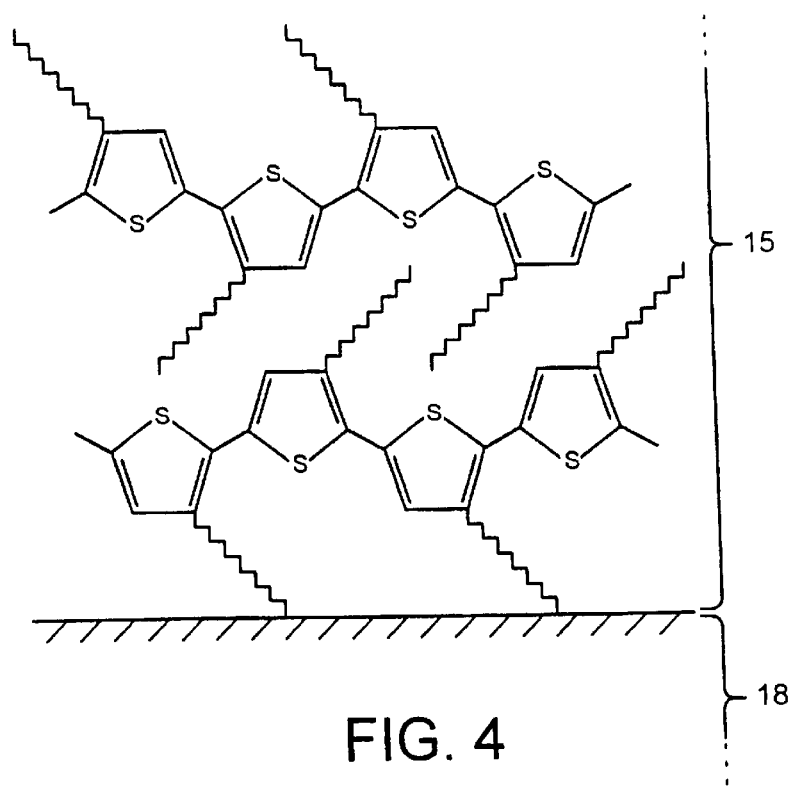
FIG. 4 shows an idealised ordered P3HT structure.

To promote the formation of an ordered lamellar structure it has been found to be useful to pre-treat the surface of the SiO$_2$ layer 18 (see FIG. 4) prior to deposition of the P3HT layer 15. Normally the surface of SiO$_2$ is terminated with hydroxyl groups, making the surface hydrophilic. A thin layer of water therefore tends to lie over the surface. To encourage the alkyl chains of the P3HT to the surface of the SiO$_2$ substrate (as shown in FIG. 4) the surface of the SiO$_2$ is treated with a silylating agent such as hexamethyldisalazane (HMDS) or alkyltrichlorosilane to replace the natural hydroxyl groups with alkyl groups (specifically methyl groups). After this treatment to remove the surface water and make the surface of the substrate hydrophobic there is a greater attraction of the P3HT's alkyl chains to the substrate.

An ordered structure in the P3HT layer can also be encouraged by careful choice of the parameters of the P3HT deposition step itself. In certain solvents P3HT tends to aggregate in solution. It has been found that by supporting this tendency to self-organise the ordering of the final P3HT layer can be improved. A stronger concentration of P3HT results in greater self-organisation but (since the solution is more viscous) a thicker film of P3HT after deposition. Since charge flow through the bulk of the P3HT is believed to have little part in the operation of the final device a thick film of P3HT is not preferred. Therefore, a preferred process for deposition of the P3HT layer is to dissolve P3HT in chloroform (CHCl$_3$) at a concentration of 13 mg of P3HT to 1 ml of chloroform and spin-coat this solution on to the substrate at a 200 rpm spin speed to yield a film of thickness 500 Å. It has also been found to be useful to place the solution on the substrate, to leave it there for some time, e.g. until it appears to start to dry, and then to begin the spin-coating; this appears to further support self-organisation of the P3HT.

Current flow from source to drain through the P3HT layer when a gate voltage is applied is believed to be generally as indicated by arrow A in FIG. 2. It is believed that one reason why adoption of the structure illustrated in FIG. 4 may be advantageous is that the best conduction in P3HT is in the direction along the conjugated backbone or by π— transfer between adjacent chains in the direction out of the general plane of the thiophene groups. It is believed that the P3HT may enhance charge conduction between the source and drain by aligning itself so that (as illustrated in FIG. 4) the plane containing those directions is parallel or generally parallel with the direction between the source and drain electrodes.

After the P3HT film has been laid down, the source 12 and drain 16 electrodes are deposited by evaporation in high vacuum through a shadow mask at a rate of around 2 to 5 Å/s to a thickness of around 500 to 1000 Å. The source and drain electrodes are of gold. Other materials and other methods of deposition may, of course be used. The electrodes may help to protect underlying layers, especially from dissolution during deposition of a subsequent polymer layer. The electrodes may help to give more uniform charge carrier injection into adjacent layers.

The layer 19 of sub-stoichiometric silicon oxide (SiO$_x$, where x<2) is then deposited by thermal evaporation, again through a shadow mask. The mask defines a hole in the layer 19 over the drain electrode 16 which will define the location of the light-emissive region in the finished device. It is helpful to mechanically align the source/drain shadow mask and the shadow mask for the layer 19 to ensure correct location of the hole over the drain electrode. The insulating layer of SiO$_x$ has different wetting properties than the conducting Au electrode regions and the semiconductive polymer. The insulating layer and its wetting properties are used to enable the deposition of a continuous subsequent layer of the light-emissive material from solution. It may also be used to direct the deposition of the light-emissive layer into desired locations.

A layer 17 of methoxy-5-(2'-ethyl-hexyloxy)-p-phenylene vinylene (MEH-PPV) is then spin-coated on top of the layer 19 and the device is completed by evaporation of a semi-transparent Ca/Ag cathode 13 of thickness 20 nm.

The fact that no photolithography is needed in fabricating the device has clear advantages.

Performing the process steps in an inert atmosphere such as nitrogen or argon has been found to be advantageous. Air and water tend to degrade the surface of the SiO$_2$ layer 18, as described above, and also seem to dope the P3HT. Therefore, it is preferable to store the P3HT in an inert atmosphere before use; to make up the P3HT solution in an inert atmosphere and to perform the spin-coating in an inert atmosphere. It should be noted, however, that once the device has been fabricated the P3HT is to some extent environmentally protected by being sandwiched between the silicon oxide layers 18 and 19. This is a significant advantage of the present device. Indeed, it is believed that the substoichiometric $SiO_x$ layer 19 may act as an oxygen getter to reduce doping near the upper surface of the P3HT. This is important because current flow at that surface of the P3HT is believed to contribute to charge leakage from the source to the drain when the transistor is in its off state. (See arrow B in FIG. 2). Reduction of doping there may therefore improve the on-off ratio of the transistor. The gettering effect of the $SiO_x$ layer 19 may be further enhanced by providing a hydrophilic layer over the P3HT layer. The bulk doping of the final P3HT layer may be around $5 \times 10^{15}$ cm$^{-3}$. (This can be estimated from capacitance-voltage measurements).

Figure 5:
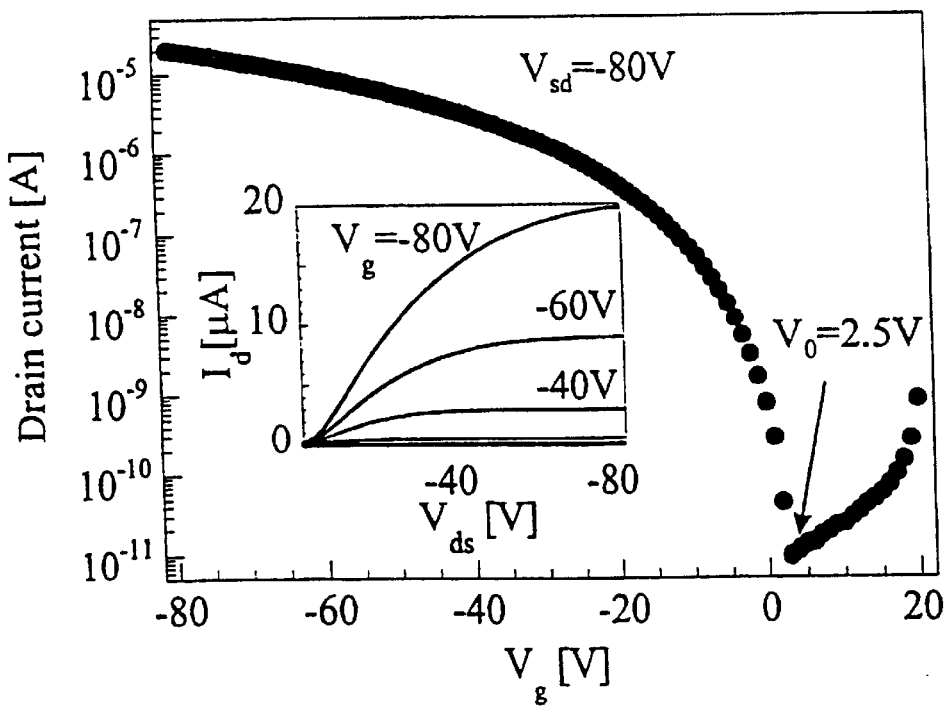
FIG. 5 shows the output and transfer characteristics of the integrated transistor of FIG. 2.

FIG. 5 shows the output and transfer characteristics of the transistor portion of an example of the present device where the channel length (L in FIG. 2) is 155 $\mu$m, the channel width (W) is 1500 $\mu$m and the source-drain voltage ($V_{sd}$) is −80V. (Clearly, much smaller devices than this could be made, and further performance improvements would be expected). FIG. 5 shows that the transistor switches on at around $V_0=0$ to 4V with sharp turn-on characteristics with subthreshold slopes of 1 to 1.5V/decade. The on/off ratio between $V_g$=0V and $V_g$=−60V exceeds $10^6$, which represents an improvement by more than two orders of magnitude over the performance noted in the paper by Z. Bao et al. cited above. The off current is believed to be limited by gate leakage through the oxide layer 18. These figures show that the performance of the present transistor device is comparable with conventional amorphous silicon (a-Si) devices (see C. C. Wu et al., IEEE Electron Device Letters 18, 609 (1997)). From the transfer characteristics in the saturation regime mobilities of $\mu_{FET}^{sat}$=0.05 to 0.1 cm$^2$/Vs can be extracted. This is also a significant improvement over the prior art. Bulk conductivity is also reduced and is estimated to be less than $10^{-8}$ S/cm.

Figure 6:
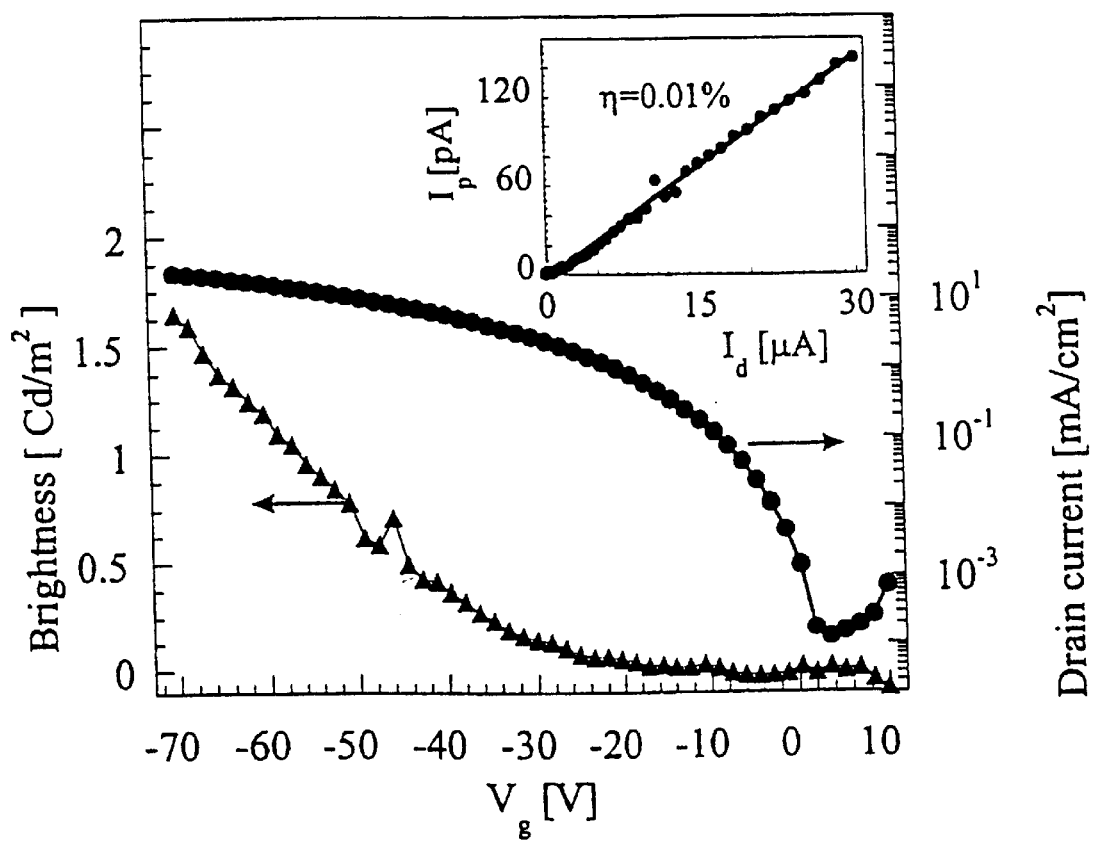
FIG. 6 shows the performance of the LED and transistor of FIG. 2 in combination.

FIG. 6 illustrates the performance of the light emitting device in combination with the transistor, showing brightness of the LED (triangles) and drain current supplied by the FET to the LED (circles) as a function of FET gate voltage, with $V_{sd}$=−70V. The device used had an LED area of 300 $\mu$m×430 $\mu$m and L=75 $\mu$m, W=1500 $\mu$m. At $V_g$=−50V the FET supplies a current density of ~10 mA/cm$^2$ to the LED, resulting in a brightness of the order of 1 to 5 cd/m$^2$. The insert in FIG. 6 shows the (linear) relationship between the drain current ($I_d$) and the photocurrent ($I_p$) detected by a Si photodiode mounted above the LED. From this the external quantum efficiency of the LED can be estimated to be of the order of $\eta_{exc}$=0.01%. More efficient light-emitting devices could be made using well-known techniques such as providing charge transport layers, e.g. of polystyrene sulphonic acid doped polyethylene dioxythiophene (PEDOT-PSS), between one or both of the LED electrodes 13, 16 and the light-emissive layer; using another emissive material instead of MEH-PPV, or a blend of materials; or using different materials for the electrodes. (See D. Braun and A. Heeger, Appl. Phys. Lett. 58, 1983 (1991); and N. C. Greenham and R. H. Friend, Solid State Physics (Academic Press, San Diego, 1995) Vol. 49, pp 1–149). As is shown below with an LED with external quantum efficiency of 1% the current density of 10 mA/cm$^2$ is sufficient for video-brightness displays of 100 Cd/m$^2$.

Figure 7:
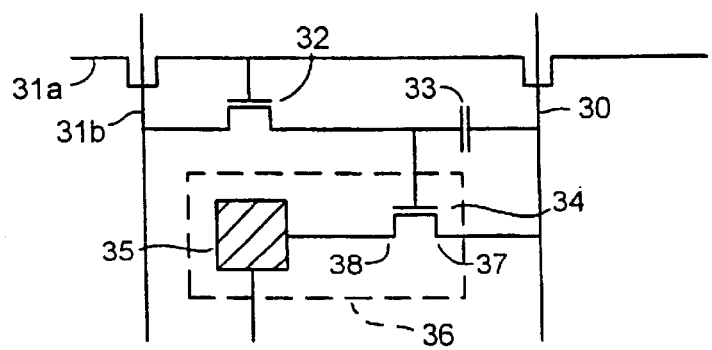
FIG. 7 shows part of a typical active matrix display circuit for current-switching applications.
Figure 8:
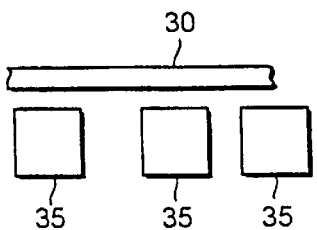
FIG. 8 shows a schematic plan view of the layout of a display device having an array of pixels.

As an example for an optical data transmission element in which the device could be used FIG. 7 shows the usual circuit for controlling a pixel of an active matrix LED display (see, for example, U.S. Pat. No. 5,550,066, the contents of which are incorporated herein by reference), where line 30 is the current supply line, lines 31a and 31b are the row and column lines, transistor 32 is the switching transistor, capacitor 33 is the storage capacitor, transistor 34 is the current transistor and 35 indicates the light-emissive pixel itself. The integrated LED and transistor of FIG. 2 could embody the pixel 35 and the transistor 34, enclosed by the dashed line at 36 in FIG. 7. This represents an especially convenient embodiment of such an active matrix circuit. FIG. 8 shows a plan view of one layout that could be used in a multi-pixel display, with the current supply line 30 running beside a row of pixels 35 and connecting the source electrodes 12 (shown at 37 in FIG. 7) of those pixels' transistors together. The gates 14 (shown at 38 in FIG. 7) of the transistors could be supplied from below or from other circuitry on the same plane. The transistors 32 could be provided by other transistors of the type described above and the capacitor 33 could be provided by an organic or inorganic dielectric layer.

Alternative materials could be used in all the layers of the device of FIG. 2. Instead of P3HT similar polymers with longer or shorter alkyl side-chains or other semiconductive polymers with a tendency to self-organise could be used, such as poly-thienylenevinylenes (PTV) (A. R. Brown et al., Science 270, 972 (1995)), poly-paraphenylenes (PPP) (G. Klärner et al., Synth. Met. 84, 297 (1997)), polydiacetylenes (K. Donovan, et al. Phil. Mag. B 44, 9 (1981)) or liquid crystalline molecules and polymers. One preferred approach may be to use polymers for all the layers, replacing the metal electrodes with a conductive polymer such as polyaniline and the silicon oxides with, for example, polymethyl-methacrylate (PMMA) (see G. Horowitz et al., Adv. Mat. 8, 52 (1996)). An all-polymer device of this type has clear process advantages in fabrication.

It may be advantageous for the lamellar structure to generally take the form of alternating layers of conjugated and non-conjugated regions of polymers.

Poly-3-hexylthiophene is an example of a conjugated polymer with a rigid-rod conjugated backbone and flexible side chains. The latter make the polymer soluble in common organic solvents. However, the side chains are often electrically insulating.

Like most other rigid-rod polymers with flexible side chains such as poly-dialkoxy-p-phenylene-vinylene (S.-A. Chen, E.-C. Chang, Macromoelcules 31, 4899 (1998)), poly-alkyl-diacetylenes, or poly-phenylene-terephthalates (for a review see D. Neher, Adv. Mat. 7, 691 (1995)) poly-3-alkylthiophenes adopt a lamellar-type structure in the solid state. Two-dimensional (2D) conjugated planes are formed by the conjugated backbones and π—π interchain stacking between adjacent chains. The conjugated planes are separated by layers of insulating side chains. High charge carrier mobilities in FET devices are obtained if the conjugated lamellae are oriented parallel to the plane of the film. If the polymer has no preferential orientation or if the layers are oriented normal to the film mobilities are by more than two orders of magnitude smaller. This is thought to be because in the parallel orientation charge carriers can easily move from chain to chain along the direction of π—π interchain stacking without being hindered by the insulating side chains. Therefore, a lamellar structure with parallel orientation of the conjugated layers is most likely to yield high mobilities in rigid-rod conjugated polymers with flexible side chains. Other polymers that may exhibit such behaviour include polyfluorenes such as poly-(2,7-(9,9-di-n-octylfluorene)-3,6-benzothiadiazole) ("F8BT").

Since the general current flow in the transistor is in the direction of arrow A in FIG. 2 it may be advantageous to promote alignment of the P3HT chains in that direction, for example by depositing the P3HT onto a substrate with a preferred linear orientation induced by mechanical rubbing, photoalignment (M. Schadt et al., Nature 381, 212 (1996)) etc., in addition to promoting ordering in the direction normal to the plane of the P3HT layer.

Figure 9:
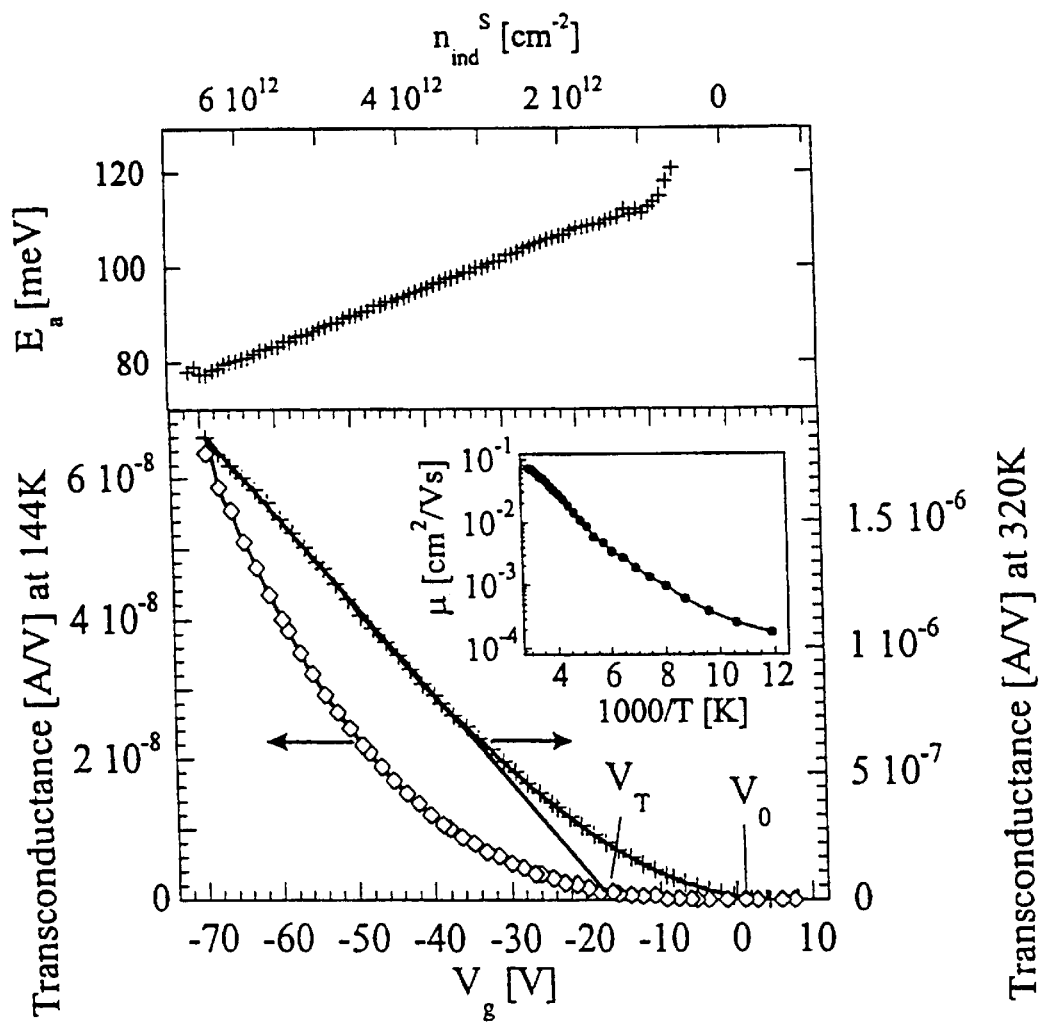
FIG. 9 shows the transconductance in the saturation regime of a typical P3HT FET at 320K and 144K.

It is believed that the improved performance of the transistor described herein may be due to the formation of extended current transporting states. For these states to be formed there would be expected to be pronounced short-range, if not microcrystalline order. The ordered lamellar structure of the P3HT may result in an electronic structure with extended states due to the self-organised, short-range order and localised states associated with grain boundaries, aggregates, conformational defects, residual doping, etc. It may be that the Fermi level ($E_F$) enters the distribution of localised states, as would for example be the case with a relatively broad distribution with small density of states, so that/$\mu_{FET}$ would show a strong dependence on the gate voltage $V_g$. FIG. 9 shows the transconductance in the saturation regime of a P3HT FET at 320K and 144K.

Figure 1:
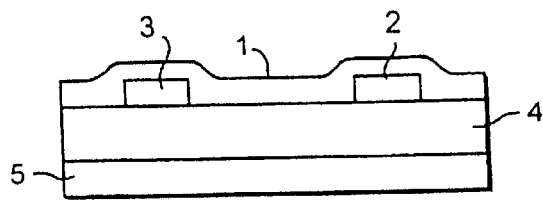
FIG. 1 shows a schematic cross-section of a thin film transistor of the prior art.

It should be noted that the use of the top source and drain contacts (as shown in FIG. 2) rather than bottom contacts (as shown in FIG. 1) is believed to help to ordering of the P3HT by allowing a smooth surface for the P3HT to be deposited upon. However, bottom electrodes (or other electrode configurations) could be used.

The use of polymer conjugated materials (such as P3HT) rather than oligomer/small molecule materials also provides some process advantages. Polymer materials can generally be deposited at room temperature, making processing easier and cheaper and affording compatibility with a wider range of substrate materials (e.g. plastics instead of glass for a display device). Polymers are also generally more robust and less prone to damage during post-processing steps.

Another advantage of polymer devices, especially over inorganic devices, is that polymer layers are generally flexible. This can reduce problems of mismatch between successive layers, making multi-layer integration easier.

Instead of supplying an organic LED as shown above, the transistor of FIG. 2 could be used as part of any compatible integrated circuit, used to supply an optoelectrical device to emit an optical signal, or to supply an inorganic LED or another type of display device such as a liquid crystal pixel or a memory element, a logic element or another polymer transistor. The device's improved through-current makes it especially suitable for supplying circuit element(s) that use significant currents (for instance to perform a function such as emitting light or for the purpose of charge storage) rather than (or in addition to) merely switching.

The $SiO_x$ layer 19 could be omitted, relying on the area of overlap of the electrodes 13 and 16 to define the light-emissive region of the device. In fabricating the device it would then be important to ensure solvent compatibility with the material of layer 15 during deposition of the layer 17. Avoiding this difficulty is another advantage of the layer 19.

Figure 11:
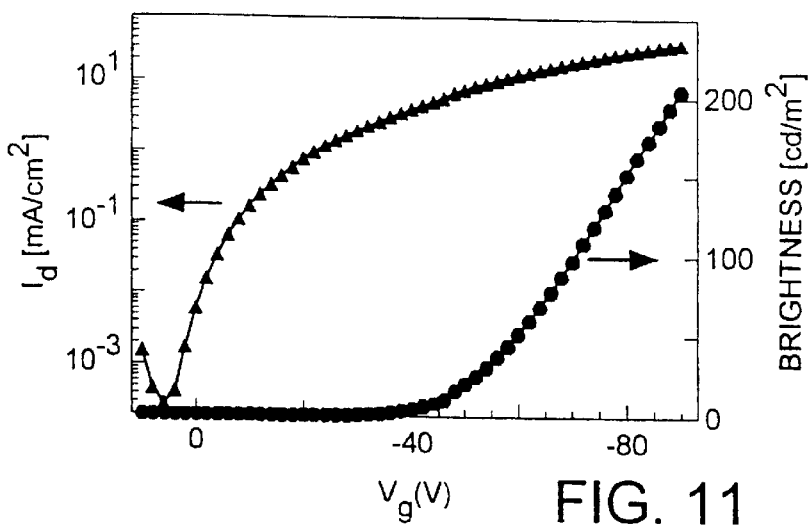
FIG. 11 shows the improved performance of an LED and transistor in combination as in FIG. 2 with the MEH-PPV LED replaced by a more efficient F8BT/BFA LED.

The performance of FET-LED could be improved by replacing the single layer MEH-PPV described above with a double-layer LED using a hole transporting layer of poly (2,7-(9,9-di-n-octyllfluorene)-(1,4-phenylene-((3-carboxyphenyl)imino)-1,4-phenylene-((3-carboxyphenyl)imino)-1,4-phenylene)) (BFA) and a light-emissive polymer layer of F8BT. With such a double-layer LED practical video brightnesses in excess of 100 $Cd/m^2$ have been obtained (See FIG. 11).

Figure 12:
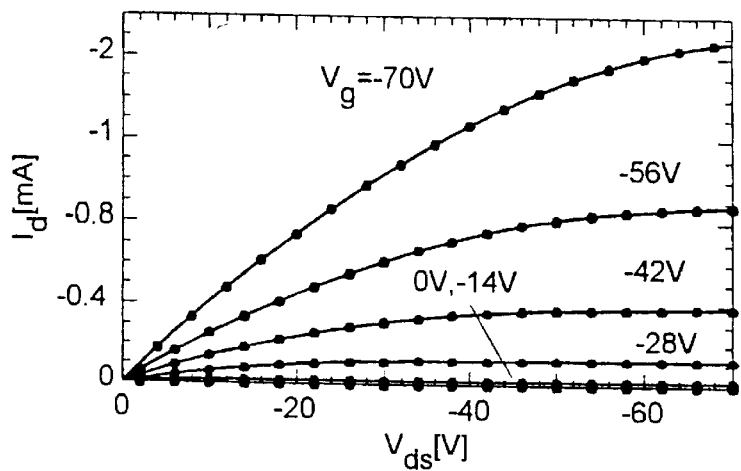
FIG. 12 shows output (top) and transfer (bottom) characteristics of a typical P3HT FET as in FIG. 1.
Figure 12:
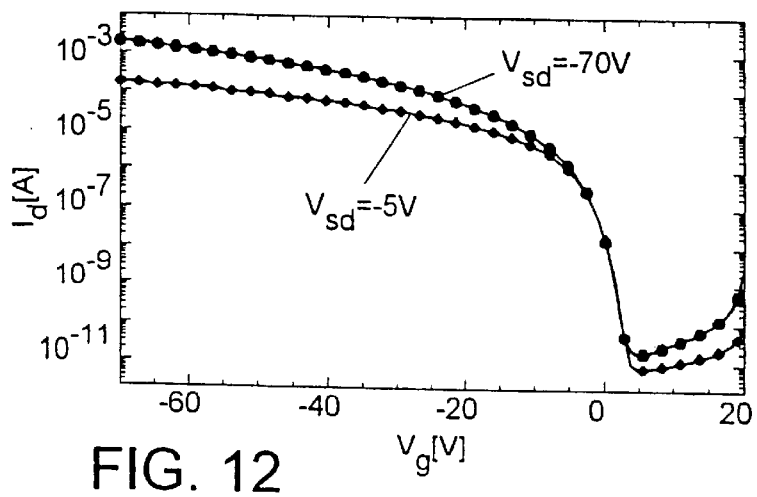

P3HT FETs with field-effect mobilities of 0.05–0.1 $cm^2/Vs$ and ON-OFF current ratio of $10^6$–$10^8$ have been fabricated. To obtain high ON-OFF current ratio the processing is performed under inert $N_2$ atmosphere and residual doping atoms are reduced chemically, for example by evaporating a layer of substoichiometric $SiO_x$ onto the surface of the P3HT or by exposing the films to reducing hydrazine vapour for a few minutes. The characteristics of such a device are shown in FIG. 12. They are comparable to those of a-Si thin-film transistors.

Figure 13:
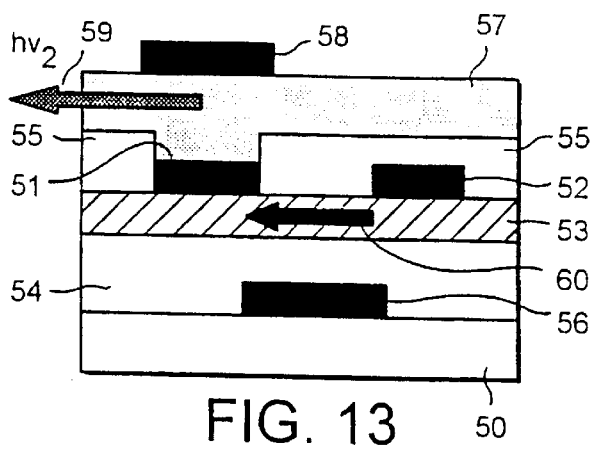
FIGS. 13 and 14 show integrated devices with a transistor as the first circuit element and a photovoltaic device (FIG. 13) or a light-emissive device (FIG. 14) as the second circuit element.
Figure 14:
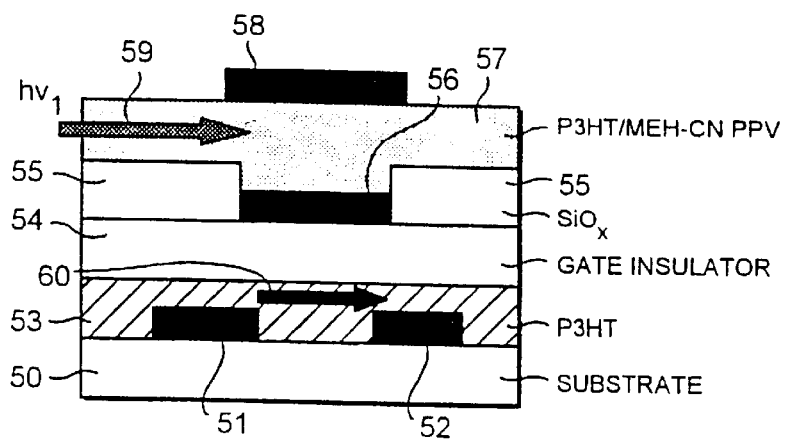

Instead of transmitting an optical signal from the second circuit element (for example, an LED) by supplying a drive current to it from the first circuit element (FET), one may also detect an optical signal with the second circuit element and convert it into a current or voltage signal with the first circuit element. One possible implementation of such a function is shown in FIG. 13, in which the second circuit element is a polymer photodiode operating in either the photovoltaic or photocurrent mode sandwiched between a cathode and the floating gate electrode of a polymer transistor. When the photodiode absorbs light a photovoltage is developed on the gate electrode of the transistor resulting in a modulation of the transistor source-drain current. The configuration of this integrated photodiode-FET device is analogous to that of the LED-FET device (shown for comparison in FIG. 14). It could be the first stage of a circuit to amplify the signal from the photodiode for further processing in a logic circuit.

In FIGS. 13 to 18 the components of the illustrated devices are indicated by the following reference numerals: substrate 50, drain electrode 51, source electrode 52, transistor active region 53, gate insulator layer 54, insulator layer 55, gate electrode 56, light-emissive/light-sensitive region 57, electrode 58, light direction arrow 59, switching current flow arrow 60.

The active layer 57 of the polymer photodiode of FIG. 13 comprises a photoconductive polymer or a blend of photoconductive polymers in a single or multilayer configuration. Possible examples are blends of poly-octyl-thiophene (P3OT) or P3HT with methoxy-5-(2'-ethyl-hexyloxy)-cyano-phenylene-vinylene (MEH-CN-PPV) (see M. Granström, K. Petritsch, A. C. Arias, A. Lux, M. R. Andersson, R. H. Friend, Nature 395, 257 (1998); J. J. M. Halls et al., Nature 376, 498 (1995)).

Figure 19:
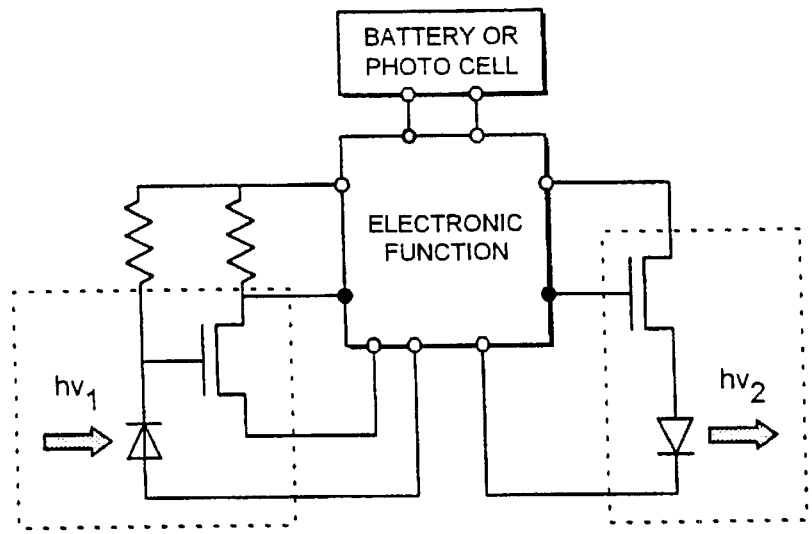
FIGS. 19 and 20 are schematic circuit diagrams for integrated device arrangements.

The transmitter and receiver devices described above may be used together to form integrated optoelectronic circuits in which an optical signal is detected, and converted into another optical signal according to a specified logic function. The logic function may be executed by an integrated logic circuit with transistors as key elements (C. J. Drury et al., Appl. Phys. Lett. 73, 108 (1998)). This is illustrated schematically in FIG. 19. The wavelength of the incoming and outgoing signals may be the same or different. Either or both of them may be outside the spectrum visible to the human eye. The device may be realised on a common substrate by integrating the detecting, transmitting and electronic components. The electrical power required to operate such a circuit may be provided by a photovoltaic cell (J. J. M. Halls et al., Nature 376, 498 (1995)) or a thin-film battery (A. G. Mac Diarmid, R. B. Kaner, in "Handbook of Conducting Polymers", ed. T. A. Skotheim, Vol. 1, p. 689 (Marcel Dekker, New York, 1986) integrated onto the same substrate. Some or all of the components of the integrated optoelectronic circuit may be organic. Some or all of the components may be polymers which can be processed from solution and patterned by suitable techniques such as ink-jet printing.

Figure 20:
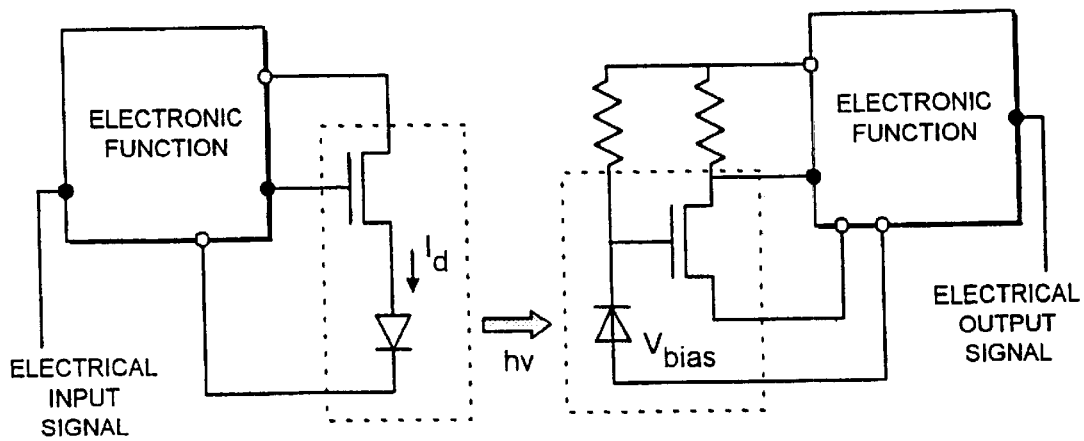

The transmitter and receiver devices may also be fabricated on separate substrates. A light signal may be used to transmit data between the two devices. This is illustrated schematically in FIG. 20.

Figure 15:
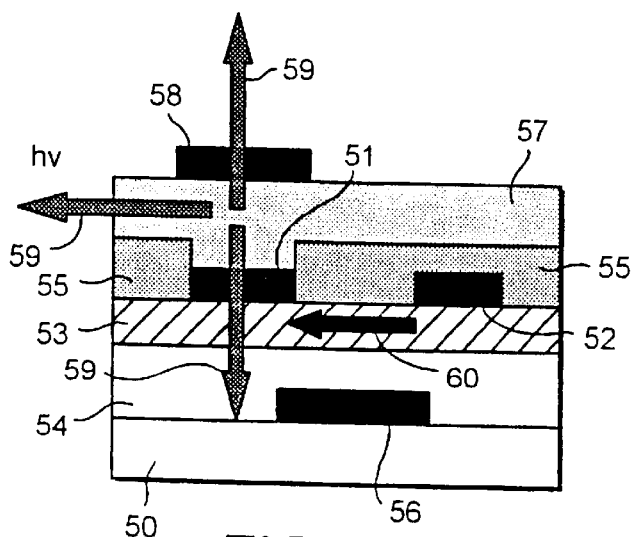
FIGS. 15 to 18 show examples of schematic structures of integrated devices.
Figure 16:
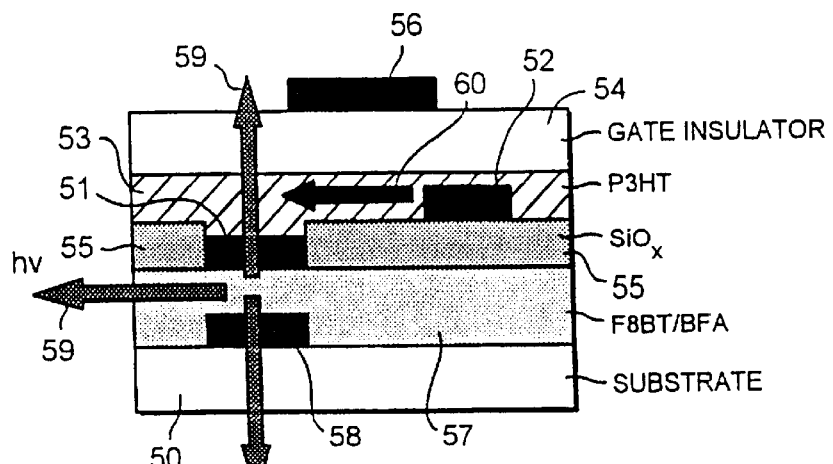
Figure 17:
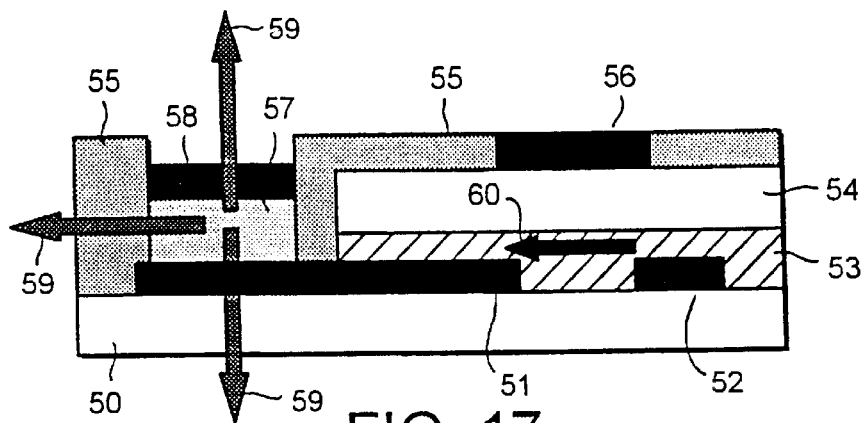

A light transmitter and receiver may be integrated as first and second circuit elements in different configurations. The second circuit element may either be on top of the first element (FIG. 15), below the first element (FIG. 16) or next to the first element (FIG. 17). FIGS. 15 to 17 show example configurations. The light may be emitted through the top/or bottom electrode. The electrodes of the LED may be semi-transparent (for example, thin metal films) or transparent (such as indium-tin-oxide conductors).

Figure 18:
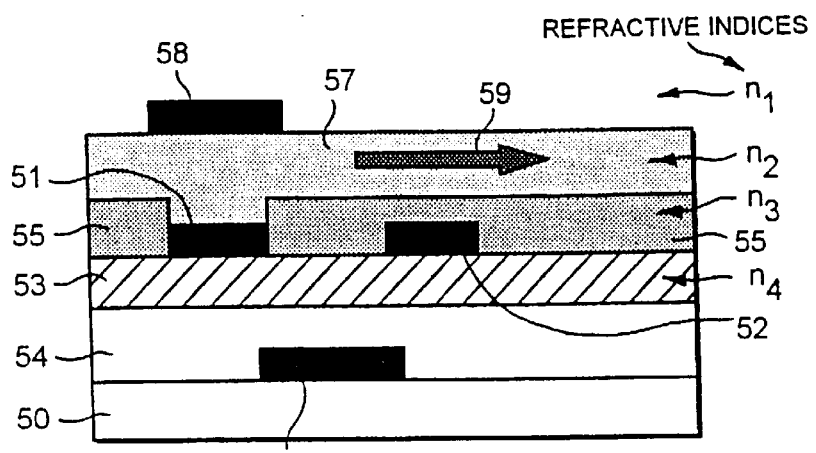

The light may also be coupled into a waveguide (FIG. 18). To provide waveguiding the usual refractive index relationships must be observed: in this case $n_2 > n_1$ (air), $n_3$ (SiO,), $n_4$ (P3HT). This can be used to channel towards external internal ports which have optical/electrical functionality. To couple the light into the transistor or other elements in a lower or upper level the refractive index contrast may be suitably reduced or reversed so as to allow coupling through leaky waveguide modes or the tail of a truly guided mode.

One or more of the layers of the device may include nanoparticles to enhance their operation.

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

What is claimed is:

1. An integrated circuit device comprising:
   a current drive switching element having an input electrode, an output electrode, a switchable region comprising a semiconductive polymer material electrically coupled between the input electrode and the output electrode, and a control electrode electrically coupled to the switchable region so as to allow the application of a bias to the control electrode to vary the flow of current through the switchable region between the input electrode and the output electrode; and
   a second circuit element, integrated with the switching element, and electrically coupled with the output electrode of the switching element for receiving a drive current from the switching element.

2. An integrated circuit device as claimed in claim 1, wherein the integrated circuit device is made up of layers, the switching element being provided by a first layer and the second circuit element being provided by a second layer.

3. An integrated circuit device as claimed in claim 2, comprising an insulating layer between the first layer and the second layer.

4. An integrated circuit device as claimed in claim 3, comprising electrically conductive interconnects that pass through the insulating layer to electrically connect the switching element and the second circuit element.

5. An integrated circuit device as claimed in claim 1, wherein the second circuit element is a display element.

6. An integrated circuit device as claimed in claim 1, wherein the second circuit element is a light-emissive element.

7. An integrated circuit device as claimed in claim 6, wherein the light-emissive element comprises a light-emissive organic material.

8. An integrated circuit device as claimed in claim 7, wherein the light-emissive organic material is a light-emissive polymer material.

9. An integrated circuit device as claimed in claim 6, wherein the output electrode of the switching element is one electrode of the light-emissive element.

10. An integrated circuit device as claimed in claim 5, wherein the switching element is part of an active matrix control circuit for the display element.

11. An integrated circuit device as claimed in claim 1, wherein, at least in part, the semiconductive polymer material is ordered as between polymer chains.

12. An integrated circuit device as claimed in claim 1, wherein, at least in part, the semiconductive polymer material is phase-separated.

13. An integrated circuit device as claimed in claim 1, wherein the semiconductive polymer material is a material that has a tendency to self-organise.

14. An integrated circuit device as claimed in claim 13, wherein the semiconductive polymer material is a material that has a tendency to self-organise in a lamellar structure.

15. An integrated circuit device as claimed in claim 14, wherein the semiconductive polymer material is a material that has a tendency to self-organise in a lamellar structure in which layers of conjugated regions alternate with layers of non-conjugated regions.

16. An integrated circuit device as claimed in claim 1, wherein the semiconductive polymer has a conjugated backbone.

17. An integrated circuit device as claimed in claim 1, wherein the semiconductive polymer has substituents either in or pendent from its backbone which promote ordering of adjacent polymer chains.

18. An integrated circuit device as claimed in claim 1, wherein the semiconductive polymer has hydrophobic side-chains.

19. An integrated circuit device as claimed in claim 1, wherein the semiconductive polymer is poly-hexylthiophene.

20. An integrated circuit device as claimed in claim 1, wherein at least one of the input, output and control electrodes comprises an organic material.

21. An integrated circuit device as claimed in claim 3, wherein the insulating layer comprises an organic material.

22. An integrated circuit device as claimed in claim 1, wherein the switchable region is in the form of a layer located between the control electrode and the input and output electrodes.

23. A method for forming an electronic device having a region comprising a semiconductive polymer material, the method comprising depositing the semiconductive polymer by a process which promotes ordering in the deposited polymer, wherein the step of depositing the semiconductive polymer comprises preparing a substrate to promote the ordering of the polymer and depositing the polymer onto the substrate.

24. A method as claimed in claim 23, wherein the step of depositing the semiconductive polymer comprises dissolving the polymer in a solvent in which the polymer has a tendency to self-organise.

25. A method as claimed in claim 23, wherein the step of depositing the semiconductive polymer comprises coating the polymer from a solvent in which the polymer has a tendency to self-organise.

26. A method as claimed in claim 23, wherein the step of depositing the semiconductive polymer is performed in an inert atmosphere.

27. A method for forming an electronic device having a region comprising a semiconductive polymer material, the method comprising depositing the semiconductive polymer by a process which promotes ordering in the deposited polymer, wherein the step of depositing the semiconductive polymer comprises coating the polymer from a solvent in which the polymer had a tendency to self-organise, and is performed in an inert atmosphere.

28. A method as claimed in claim 23 wherein the step of preparing the substrate comprises making the surface of the substrate more hydrophobic.

29. A method as claimed in claim 23, wherein the method comprises depositing at least one electrode over the semiconductive polymer.

30. A method as claimed in claim 23, wherein the polymer is a material that has a tendency to self-organise.

31. A method as claimed in claim 23, wherein the polymer has a conjugated backbone.

32. A method as claimed in claim 23, wherein the polymer has substituents either in or pendent from its backbone which promote ordering of adjacent polymer chains.

33. A method as claimed in claim 23, wherein the polymer has hydrophobic side-chains.

34. A method as claimed in claim 23, wherein the polymer is polyhexylthiophene.

35. A method as claimed in claim 23, further comprising the step of forming a light-emissive device over the electronic device.

36. A method as claimed in claim 35, wherein the light-emissive device is integrated with the electronic device.

37. A method as claimed in claim 34, wherein the light-emissive device comprises a light-emissive organic material.

38. A method as claimed in claim 23, wherein the electronic device is a switching device.

39. A method as claimed in claim 38, wherein the electronic device is a transistor.

40. A method as claimed in claim 38, wherein the electronic device comprises an input electrode, an output electrode, a switchable region electrically coupled between the input electrode and the output electrode and which comprises the semiconductive polymer material, and a control electrode electrically coupled to the switchable region so as to allow the application of a bias to the control electrode to vary the flow of current through the switchable region between the input electrode and the output electrode.

41. A method as claimed in claim 23, wherein the wetting properties of the surface of the semiconductive polymer are engineered to enable the deposition of subsequent layers on top of it.

42. A method as claimed in claim 23, further comprising the step of forming an insulating layer on top of the semiconductive polymer.

43. A method as claimed in claim 42, wherein the insulating layer is of a material that is capable of attracting residual dopants from the semiconductive polymer.

44. A method as claimed in claim 42, wherein the wetting properties of the surface of the insulating layer are engineered to enable the deposition of another layer on top of it.

45. A method as claimed in claim 42, wherein different wetting properties of the surface of the insulating layer and that of adjacent conductive regions are used to guide the deposition of subsequent layers into a desired location.

46. A method as claimed in claim 35, wherein an insulating layer is used to avoid dissolving and degradation of the semiconductive polymer during the forming of the light-emissive device.

47. A method as claimed in claim 42, wherein the mechanical properties of the insulating layer resist delamination of the device or other types of mechanical failure.

48. A method as claimed in claim 35, wherein a conducting layer between the electronic device and light-emissive device is deposited to ensure electrical compatibility between the two device.

49. A method as claimed in claim 48, wherein the conducting layer ensures uniform current injection into the light-emissive device.

50. A method as claimed in claim 48, wherein the conducting layer ensures efficient carrier injection into the light-emissive device.

51. An integrated circuit device comprising:
a current drive switching element having an input electrode, an output electrode, a switchable region comprising a semiconductive polymer material electrically coupled between the input electrode and the output electrode, and a control electrode electrically coupled to the switchable region so as to allow the application of a bias to the control electrode to vary the flow of current through the switchable region between the input electrode and output electrode; and
an electro-optical circuit element, integrated with the switching element, and electrically coupled to an electrode of the switching element.

52. An integrated circuit device as claimed in claim 51, wherein the integrated circuit device is made up of layers, the switching element being provided by a first layer and the electro-optical circuit element being provided by a second layer.

53. An integrated circuit device comprising:
a switching element having an input electrode, an output electrode, a switchable region comprising a semiconductive polymer material electrically coupled between the input electrode and the output electrode, and a control electrode electrically coupled to the switchable region so as to allow the application of a bias to the control electrode to vary the flow of current through the switchable region between the input electrode and the output electrode; and
a second circuit element, integrated with the switching element in a multilayer-stack configuration, and electrically coupled to an electrode of the switching element.

54. An integrated circuit device as claimed in claim 53, in which the second circuit element is also switching element.

55. An integrated circuit device as claimed in claim 52, comprising an insulating layer between the first layer and the second layer.

56. An integrated circuit device as claimed in claim 55, comprising electrically conductive interconnects that pass through the insulating layer to electrically connect the switching element and the electro-optical circuit element.

57. An integrated circuit device as claimed in claim 51, wherein the electro-optical circuit element is a light-emissive element.

58. An integrated circuit device as claimed in claim 57, wherein an input electrode of the electro-optical circuit element is electrically coupled to an output electrode of the switching element.

59. An integrated circuit device as claimed in claim 53, wherein the second circuit element is a light-sensitive element.

60. An integrated circuit device as claimed in claim 59, wherein an output electrode of the light-sensitive element is electrically coupled to an input electrode of the switching element.

61. An integrated circuit device as claimed in claim 59, wherein an output electrode of the light-sensitive element is electrically coupled to the control electrode of the switching element.

62. An integrated circuit device as claimed in claim 51, wherein the electro-optical element has an opto-electrically active region comprising a light-emissive and/or light-sensitive organic material.

63. An integrated circuit device as claimed in claim 62, wherein the light-emissive and/or light-sensitive organic material is a polymer material.

64. An integrated circuit device as claimed in claim 51, wherein, at least in part, the semiconductive polymer material is ordered as between polymer chains.

65. An integrated circuit device as claimed in claim 51, wherein, at least in part, the semiconductive polymer material is phase-separated.

66. An integrated circuit device as claimed in claim 51, wherein the semiconductive polymer material is a material that has a tendency to self-organise.

67. An integrated circuit device as claimed in claim 66, wherein the semiconductive polymer material is a material that has a tendency to self-organise in a lamellar structure.

68. An integrated circuit device as claimed in claim 67, wherein the semiconductive polymer material is a material that has a tendency to self-organise in a lamellar structure in which layers of conjugated regions alternate with layers of non-conjugated regions.

69. An integrated circuit device as claimed in claim 51, wherein the semiconductive polymer has a conjugated backbone.

70. An integrated circuit device as claimed in claim 51, wherein the semiconductive polymer has substituents either in or pendent from its backbone which promote ordering of adjacent polymer chains.

71. An integrated circuit device as claimed in claim 51, wherein the semiconductive polymer has hydrophobic sidechains.

72. An integrated circuit device as claimed in claim 51, wherein the semiconductive polymer is polyhexylthiophene.

73. An integrated circuit device as claimed in claim 51, wherein at least one of the input, output and control electrodes comprises an organic material.

74. An integrated circuit device as claimed in claim 55, wherein the insulating layer comprises an organic material.

75. An integrated circuit device as claimed in claim 1 which forms part of a larger circuit which may comprise any or all of the following items: switching elements, resistive elements, capacitive elements, photovoltaic elements, photoconductive elements, light emissive elements, and or energy storage devices.

76. A method for forming an electronic device having a region comprising a semiconductive polymer material, the method comprising depositing the semiconductive polymer by a process which promotes ordering in the deposited polymer, the polymer having a lamellar structure which generally takes the form of alternating layers of conjugated and non-conjugated regions of polymers.

77. An electronic device formed by a method according to claim 23.

78. A method for forming an electronic device having a region comprising a semiconductive polymer material, the method comprising depositing the semiconductive polymer by a process which promotes ordering in the deposited polymer, the polymer having flexible side-chains and a lamellar structure with parallel orientation of the conjugated layers.

79. A method as claimed in claim 28, wherein the step of making the substrate more hydrophobic comprises treating the surface of the substrate with a self-assembled monolayer.

80. A method as claimed in claim 28, wherein the step of making the surface of the substrate more hydrophobic comprises modifying the chemical structure of the said surface.

81. A method as claimed in claim 80, wherein the step of modifying the chemical structure of the said surface comprises exposing the surface to a reactive molecule.

82. A method as claimed in claim 81, wherein said reactive molecule is a silylating agent.

83. A method as claimed in claim 81, wherein said reactive molecule is HMDS or alkyltrichlorosilane.

84. A method for forming an electronic device according to claim 78 wherein the conjugated layers are formed by backbones of the polymer.

85. A method for forming an electronic device according to claim 78, wherein the conjugated layers are formed by π—π stacking of adjacent chains.

86. A method for forming an electronic device according to claim 78, wherein the conjugated layers are separated by layers of phase-segregated side-chains.

87. A method for forming an electronic device according to claim 78, wherein the step of depositing the semiconductive polymer comprises preparing a substrate having a surface and making the said surface of the substrate more hydrophobic.

* * * * *

UNITED STATES PATENT AND TRADEMARK OFFICE
CERTIFICATE OF CORRECTION

PATENT NO. : 6,603,139 B1
DATED : August 5, 2003
INVENTOR(S) : Tessler et al.

It is certified that error appears in the above-identified patent and that said Letters Patent is hereby corrected as shown below:

Column 16,
Line 2, "device." should read -- devices. --.
Line 42, "also switching" should read -- also a switching --.

Signed and Sealed this

Fourteenth Day of October, 2003

JAMES E. ROGAN
*Director of the United States Patent and Trademark Office*